(12) United States Patent
Li et al.

(10) Patent No.: US 7,601,558 B2
(45) Date of Patent: Oct. 13, 2009

(54) TRANSPARENT ZINC OXIDE ELECTRODE HAVING A GRADED OXYGEN CONTENT

(75) Inventors: Yanping Li, Mountain View, CA (US); Yan Ye, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 110 days.

(21) Appl. No.: 11/552,261

(22) Filed: Oct. 24, 2006

(65) Prior Publication Data

US 2008/0096376 A1    Apr. 24, 2008

(51) Int. Cl.
*H01L 21/44* (2006.01)

(52) U.S. Cl. .................... 438/87; 438/98; 257/E31.126

(58) Field of Classification Search ............... 438/87, 438/98, 609
See application file for complete search history.

(56) References Cited

U.S. PATENT DOCUMENTS

| | | | |
|---|---|---|---|
| 5,135,581 A | 8/1992 | Tran et al. | 136/256 |
| 5,397,920 A | 3/1995 | Tran et al. | 257/749 |
| 5,736,267 A | 4/1998 | Mitsui et al. | 428/702 |
| 6,146,765 A | 11/2000 | Mitsui et al. | 428/428 |
| 6,822,158 B2 | 11/2004 | Ouchida et al. | 136/256 |
| 7,019,206 B2 | 3/2006 | Harneit et al. | 136/244 |
| 2002/0033331 A1 | 3/2002 | Nakayama | 204/192.27 |
| 2003/0085116 A1 | 5/2003 | Echizen et al. | 204/192.15 |
| 2004/0140198 A1 | 7/2004 | Cho et al. | 204/192.29 |
| 2004/0187914 A1* | 9/2004 | Matsuda et al. | 136/255 |
| 2004/0222089 A1 | 11/2004 | Inoue et al. | 204/298.12 |
| 2005/0000794 A1 | 1/2005 | Demaray et al. | 204/192.1 |
| 2005/0205413 A1 | 9/2005 | Ikari et al. | 204/192.13 |
| 2006/0152833 A1* | 7/2006 | Halls et al. | 359/883 |

* cited by examiner

*Primary Examiner*—Alexander G Ghyka
(74) *Attorney, Agent, or Firm*—Charles S. Guenzer

(57) ABSTRACT

A method of reactively sputtering from a metallic zinc target a transparent conductive oxide electrode of zinc oxide from a metallic zinc in a silicon photo diode device and the resultant product, such as a solar cell. The electrode in deposited on a transparent substrate in at least two steps. The oxygen partial pressure is reduced in the first step to produce an oxygen-deficient ZnO layer, which is highly conductive and has a textured surface, and is increased in the second step to produce a more stoichiometric ZnO, which has a refractive index more closely matched to the overlying silicon device. The second layer is substantially thinner than the first so the surface texture is transferred across it and the overall sheet resistance of the stack structure is reduced.

17 Claims, 3 Drawing Sheets

TRANSPARENT ZINC OXIDE ELECTRODE HAVING A GRADED OXYGEN CONTENT

FIELD OF THE INVENTION

The invention relates generally to photovoltaic semiconductor devices. In particular, the invention relates to transparent electrodes for thin film solar cells.

BACKGROUND ART

Great interest exist in commercializing solar cells to replace electrical power presently generated by coal or gas power generation plants. Coal contributes to the generation of carbon dioxide and other pollutants in the atmosphere. Natural gas is considered less polluting but still generates carbon dioxide and is also becoming very expensive.

A solar cell is a photo diode including a semiconducting p-n junction, perhaps sandwiching an intrinsic layer to provide most of the photon conversion, and having electrodes on either side to extract the electrical power derived from the photo-electric conversion within the solar cell. Solar cells were largely developed following the lead of electronic integrated circuits in which a large-size planar photo diode is formed in a crystalline substrate of silicon or less frequently gallium arsenide. Gallium arsenide has always been expensive and even thick plates of crystalline silicon have become increasingly expensive. Accordingly, the technology has been explored of thin film solar (TFS) cells in which semiconducting layers are deposited on a large foreign substrate, which may be glass, steel, or even plastic. The deposition technology is akin to that used for flat panel displays, such as LCD and plasma television screens formed on glass substrates.

A fundamental problem with TFS cells is that at least one of the electrodes must be relatively electrically conductive but optically transparent. Mesh metallic electrodes have been used for crystalline solar cells but their efficiency is degraded by geometrical factors and the mesh must be photolithographically defined. Electrodes of transparent conductive oxides (TCO) have become popular for terrestrial solar cells. The most prevalent TCO is indium tin oxide (ITO) widely used for flat panel displays, but indium is relatively expensive and not conducive to widespread or large-scale power generation. Tin oxide and zinc oxide have also been considered as TCO materials.

Zinc oxide has been the favored substitute TCO material. However, to date its performance has not been optimal since it needs to satisfy a number requirements. It needs to be highly conductive as well as highly transmissive. It needs to provide a good interface to the adjacent semiconductor material. Its refractive index should be tailored to reduce any reflectance of incident light due to a steep change in the refractive index at its two interfaces. It is desirable that the TCO be deposited by sputtering. Sputtering from a metal oxide target can be achieved either with RF sputtering or DC sputtering. Generally, RF sputtering is disfavored over DC sputtering because of its expense and low sputtering rate. However, the relatively low conductance of a metal oxide target seems to force the use of RF sputtering. Suggestions of reactive sputtering from a metal target in an oxygen ambient have not been supported by experimental verification of good product.

SUMMARY OF THE INVENTION

The invention includes a method of forming an oxygen-graded zinc oxide transparent conductive electrode by reactive sputtering of a metallic zinc-containing target in the presence of oxygen. The partial pressure of oxygen is varied during the sputtering to grade the oxygen content in the zinc oxide electrode and hence its conductivity and refractive index.

In one embodiment, a first, oxygen-deficient ZnO layer is reactively sputtered with a relatively low oxygen partial pressure onto a glass or other insulating transparent substrate. A second ZnO layer is deposited over the first ZnO layer with a high oxygen partial pressure. The thickness of the first layer is preferably greater than that of the second layer by a factor of at least 2, 4, or even more.

The invention further includes forming a silicon solar cell or other silicon photo diode over the graded ZnO layer with the illuminating light shining through the substrate. An upper electrode and an optional metallic reflector in the case of a metal oxide upper electrode may be deposited over the photo diode structure, such as a solar cell.

The invention also includes the resulting solar cell or other photo diode product in which at least one of the electrodes is a zinc oxide multi-layer structure having a graded oxygen content across it.

DETAILED DESCRIPTION OF THE PREFERRED EMBODIMENTS

Figure 1:
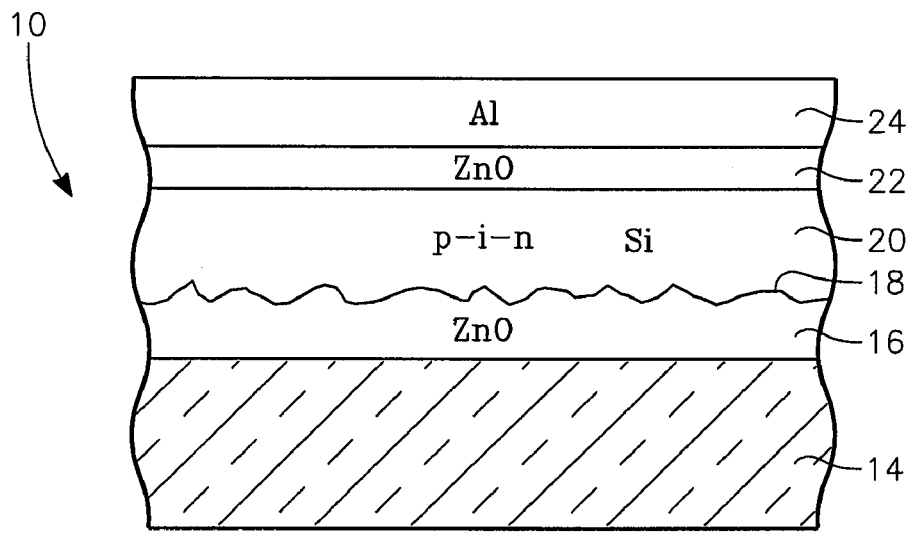
FIG. 1 is a cross-sectional view of a back illuminated thin film solar cell with which the transparent conductive oxide (TCO) electrodes of the invention may be used.

A multi-step process for reactive sputtering of zinc oxide has been demonstrated to provide a superior transparent conductive oxide (TCO) electrode for use in solar cells and other photoelectric devices. One embodiment of a thin film solar (TFS) cell 10 is illustrated in the cross-sectional view of FIG. 1. This solar cell 10 is intended for illumination by radiation 12 from an external side of a superstrate 14. On the internal side of the superstrate 14, a thin film structure is fabricated. The solar cell 10 has been demonstrated for the superstrate 14 composed of a borosilicate glass, such as Corrning 1737 glass, similarly to a flat panel display. Such a borosilicate glass has an index of refraction of about n=1.5 in comparison to n=1 for air. On the superstrate 14 is sputter deposited a transparent conductive oxide (TCO) electrode 16 of a metal oxide such as ITO or zinc oxide preferably aluminum doped. Doped zinc oxide has an index of refraction n in the range of about 2.0. A top surface 18 of the TCO electrode 16 is preferably formed with significant texturing on the order of corrugation to better confine the light to the silicon active layer.

Over the electrode 16 is deposited, typically by chemical vapor deposition (CVD), a silicon layer 20, including a p-type lower layer, an intrinsic or i-type middle layer, and an n-type upper layer. For the large solar cells being contemplated, the silicon layer 20 is typically formed as hydrogenated amorphous silicon H:a-Si by plasma-enhanced CVD of hydrogen gas $H_2$ and silane $SiH_4$ plus any desired dopant gas such as diborane $B_2H_6$ and diphosphine. The p-type layer exhibits poor hole mobility and hence is relatively thin, to reduce the resistance, and is placed on the input side to reduce the absorption of light therein. Over the silicon layer 20 is deposited a back contact 22, which may be a bilayer of a TCO layer, for example, composed of aluminum-doped ZnO, and an aluminum layer 24.

Figure 2:
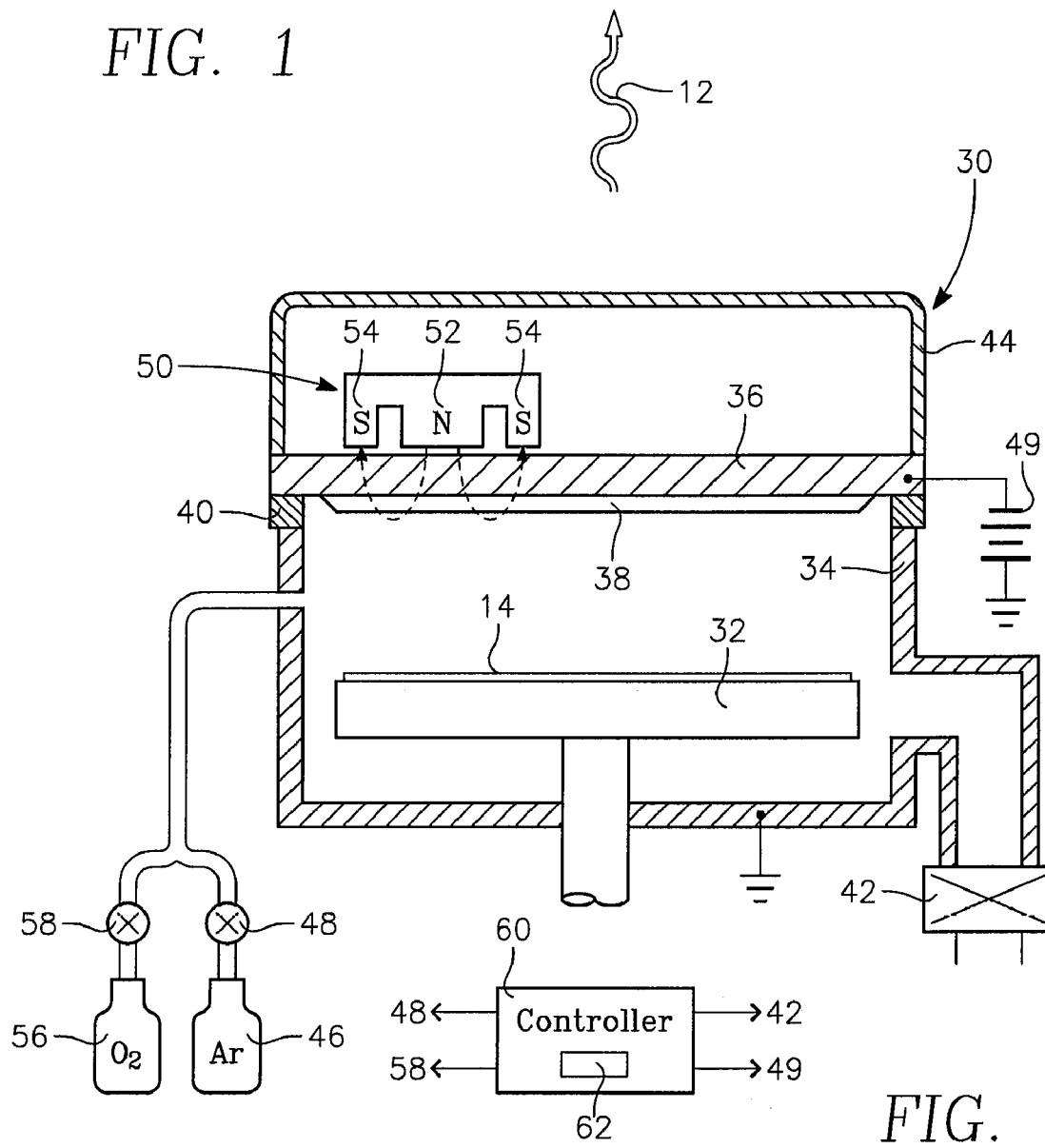
FIG. 2 is a schematic cross-sectional view of magnetron sputter reactor useful for reactive sputtering of TCO electrodes of the invention.

The zinc oxide is preferable reactively sputtered in a DC magnetron sputter chamber 30 schematically illustrated in the cross-sectional view of FIG. 2. The superstrate 14 is supported on a pedestal 32 within an electrically grounded vacuum chamber 34. A target assembly 36 having a metallic target layer 38 composed of zinc with optional aluminum alloying is supported on the chamber 34 through an electrical isolator 40. A vacuum pumping system 42 pumps the vacuum chamber to a base pressure of less than $10^{-6}$ Torr. For the large-size sputter chamber 30 contemplated for commercial production, the target assembly 36 includes a water-cooled backing plate and a vacuum-pumped back chamber 44 equalizes pressure across the thin target assembly 36.

A sputter working gas, typically argon is supplied into the vacuum chamber 34 from an argon gas source 46 through a mass flow controller 48 and an argon partial pressure within the vacuum chamber 34 is held in the low milliTorr range. A controllable DC power supply 49 applies a negative voltage in the range of 300 to 1000 VDC to the target assembly 36. The negatively biased target assembly 36 acts as a cathode in opposition to the anode of the grounded vacuum chamber 34 or grounded sputter shields within the vacuum chamber 34 to excite the argon into a plasma. Positively charged argon ions are attracted to the negatively biased target assembly 36 and sputters metal ions from the target layer 38, some of which strike the superstrate 14 to deposit sputter material on it.

To increase the density of the plasma adjacent the target layer 38, a magnetron 50 is positioned in back of the target assembly 36 within the back chamber. It typically includes an inner magnetic pole 52 of one magnetic polarity and a surrounding outer magnetic pole 54 of the opposite magnetic polarity to project a horizontal magnetic field adjacent the front surface of the target layer 38. The magnetic field traps electrons and hence increases the density of the plasma and as a result increases the sputtering rate. Typically, the magnetron 50 is scanned in at least one direction along the back of the target assembly 36 to increase the uniformity of erosion of the target and sputter deposition on the superstrate 14.

The reactive sputtering of zinc oxide and its alloys is accomplished by also supplying oxygen into the vacuum chamber 34 from an oxygen gas source 56 through a mass flow controller 58. The oxygen reacts with the sputtered zinc atoms to deposit zinc oxide on the superstrate 14. A controller 60 loaded with a processing recipe on a recordable medium 62 controls the pump system 42, DC power supply 50, and the two mass flow controllers 48, 58 according to the recipe.

Reactive DC sputtering is contrasted with non-reactive DC sputtering and RF sputtering. In non-reactive DC sputtering, no reactive gas such as oxygen is supplied into the chamber the composition of the target closely approximates that of the deposited film. DC sputtering requires that the target material be conductive. Zinc oxide is moderately conductive but its resistivity is high enough to present difficulties in implementing its non-reactive DC sputtering. In RF sputtering, RF power is applied to the target assembly 36. Even if the target layer 38 is insulating, sputtering still occurs. However, RF sputtering is slower than DC sputtering and requires more expensive power supplies and the fabrication of a ceramic target. Reactive DC sputtering of zinc oxide and other transparent oxides is thus economically advantageous.

Figure 3:
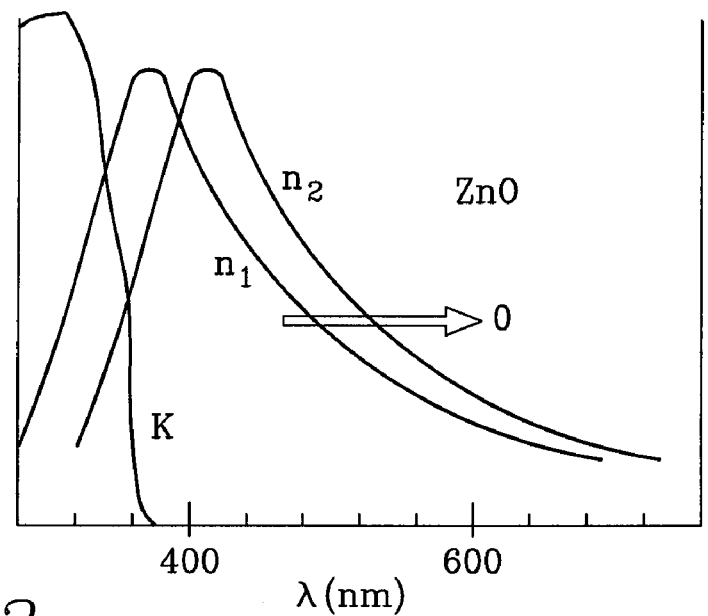
FIG. 3 is a graph plot the complex dielectric constant of one type of ZnO as function of optical wavelength.

Furthermore, according to one aspect of the invention, reactive DC sputtering of zinc oxide and other transparent oxides allows the oxygen content to be not only controlled but also to be graded across its thickness by control of the partial pressure of oxygen within the vacuum chamber 34 during sputtering. The choice of the oxygen content in zinc oxide and other transparent conductive oxides is subject to countervailing considerations. Zinc oxide (ZnO) may be considered to be a II-VI semiconductor. Any oxygen deficiency from the stated stoichiometry may be considered a vacancy and hence an electrically active donor. The response of a material including a semiconductor to electromagnetic radiation may be characterized as its having considered to have a complex dielectric function ϵ, which may be decomposed into real and imaginary parts according to $$\epsilon = (n+iK)^2,$$

where n is the refractive index and K is the extinction coefficient and both quantities may vary according to the frequency or wavelength λ of the electromagnetic radiation, in the case of solar cells, the spectrum of the solar radiation. A dielectric material is characterized as having a low conductivity or extinction coefficient K so its refractive index n dominates while a metal is characterized as having a high conductivity or extinction coefficient K so that its refractive index n is unimportant. On the other hand, the complex dielectric function of a semiconductor strongly depends on the wavelength λ of the radiation in the visible spectrum. The components $n_1$ and K of the dielectric function for zinc oxide grown by one process are illustrated in the graph of FIG. 3 in which the range of the wavelength λ extends from the near ultra-violet across the visible spectrum into the near infra-red, the region of operation of most terrestrial solar cells. The two components are not drawn to the same vertical scale. The low value of K across most of the spectrum means that a ZnO electrode is mostly transparent to solar radiation.

We have found that the value of the refractive index n can be varied principally in the visible region by varying the oxygen content in ZnO. In particular, increasing the oxygen content shifts the refractive index curve to the curve $n_2$ generally upward and to toward longer wavelengths. The refractive index is important in reducing the mismatch of refractive index at the interface between the glass superstrate (n≈1.45) and the active silicon layers (n≈4 and above).

Figure 4:
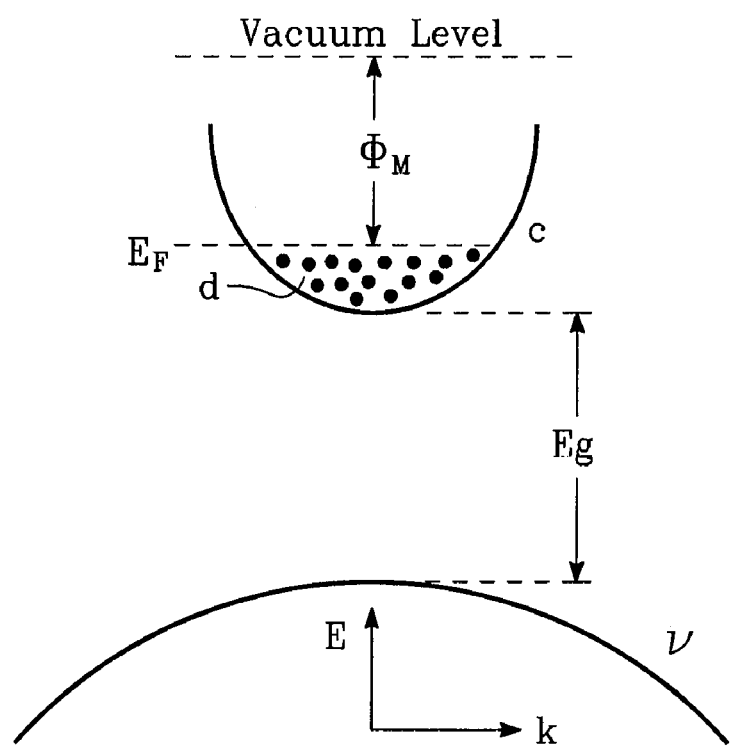
FIG. 4 is a schematic representation of a electronic band gap structure typical of conductive metal oxides.

Most transparent conductive oxides including zinc oxide may be characterized as degenerate wide band-gap semiconductors. A typical electronic band structure illustrated in FIG. 4, which plots the energy E of electronic states as a function of wave vector k, includes a valence band v and a conduction band c separated by a band gap $E_g$, which for zinc oxide is about 3.0 to 3.4 eV, that is, well into the ultra-violet. However, the conductive metal oxides are sufficiently doped with electron donors that a degenerate band d forms at the bottom of the conduction band c that is filled at normal operating temperatures and in some respect causes the semiconductor to act as a metal. Thereby, the metal oxide is an effective DC conductor. The top of the degenerate band d determines the work function $\Phi_M$ between its top, the Fermi level $E_F$ and the vacuum level, which is the free-space energy of an electron escaping from the material. For n-type zinc oxide and aluminum-doped zinc oxide, the work function $\Phi_M$ is about 5.1 eV but is significantly higher for p-type zinc oxide. We have found that the zinc-oxide work function varies with the Zn/O ratio as the degenerate band d fills more deeply because of oxygen vacancies; the higher the oxygen content, the higher the value of the work function $\Phi_M$. Larger work functions are desirable in contacting p-type amorphous silicon so that p a-Si is not depleted and the interfacial barrier is reduced Further, for the large oxygen vacancy rates contemplated by the invention, the band structure itself depends on the vacancy rate and the band gap $E_g$ also changes.

The interfacial band structure depends significantly on the difference in work functions between the two materials. For both metallic zinc and aluminum the work function $\Phi_M$ is about 4.2 eV.

A number of differing constraints are imposed upon the zinc-oxide electrode. It needs to be highly conductive at DC to reduce series resistance and to increase the solar cell fill factor. The conductivity is particularly important for a transparent electrode overlying the glass substrate 14, which itself is insulating, since current needs to flow laterally to a collecting grid. That is, the sheet resistance needs to be decreased with both low resistivity and relatively high thickness. The zinc-oxide refractive index n at the interface with the silicon layer 20 should more closely match that of silicon to reduce interface reflection arising from a mismatch in the refractive indices. As previously explained, the surface 18 of the zinc oxide layer 16 adjacent the silicon layer 20 should be strongly textured to promote light trapping within the active light-absorbing silicon layer 20. Finally, the zinc-oxide layer 18 should be resistant to a hydrogen plasma during the CVD of the silicon layer 20.

Figure 5:
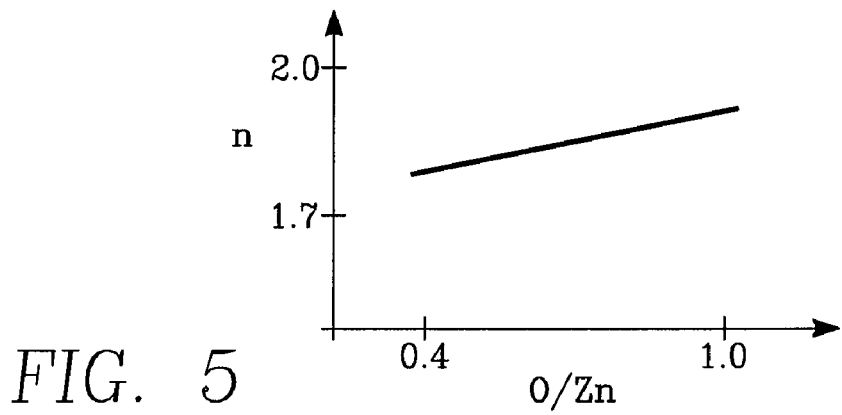
FIG. 5 is a graph illustrating the dependence of the refractive index upon the O/Zn atomic fraction in a ZnO film.

We have found in the reactive sputtering of zinc oxide, that the partial pressure of oxygen $O_2$ relative to that of argon during sputtering affects many of these characteristics. Increasing the oxygen partial pressure decreases the band gap by about 0.3 eV, which results in a significant increase in the refractive index n in the visible region. In an a-Si solar cell, the mismatch between the refractive index n=1.45 of the glass substrate and of 4.0 and greater for a-Si can result in significant reflection loss. We have been able to tune the refractive index in the visible range between about 1.7 to 1.9 and somewhat above. The increased refractive index of the TCO layer greatly reduces the total reflection loss at its interface with silicon. The refractive index n can be correlated with the O/Zn ratio in the deposited film. As illustrated in the graph of FIG. 5, as the O/Zn ratio in the deposited increases from 0.4 to 1.0, the refractive index n at a fixed wavelength, for example, 600 nm, increases from about 1.7 to about 1.9 as the band gap shrinks. Generally, a high partial pressure of oxygen promotes unity stoichiometry between zinc and oxygen in reactively sputtered ZnO, making it more like a conventional highly resistive semiconductor.

Also, a low oxygen partial pressure produces a highly conductive ZnO layer while high oxygen pressure produces a highly insulating film. Further, a low oxygen partial pressure results in a more highly textured surface of the ZnO film.

Figure 6:
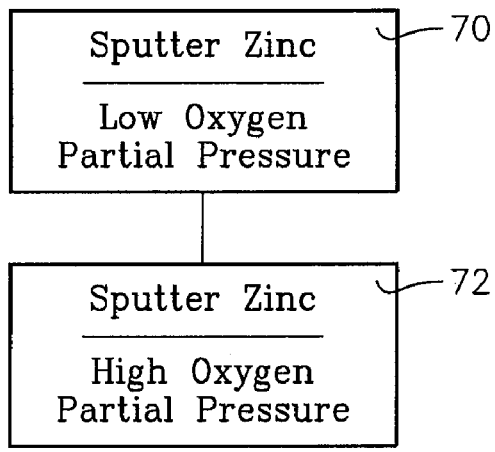
FIG. 6 is a process flow diagram for practicing one embodiment of the invention.

In one embodiment of the invention, the ZnO layer 16 is deposited in a two-step reactive sputtering process, illustrated in the flow diagram of FIG. 6. In the first step 70, DC power is applied to a metallic zinc target with the sputtering chamber containing both argon sputter working gas and a relatively low partial pressure of oxygen to reactively sputter deposit zinc oxide. In the second step 72, the zinc metallic target is similarly sputtered but the oxygen partial pressure is increased relative to that of argon to reactive sputter deposit zinc oxide, which however contains a low fraction of oxygen than in the first step. The substrate temperature is preferably maintained in a range of 150 to 400° C. during the reactive sputtering.

Figure 7:
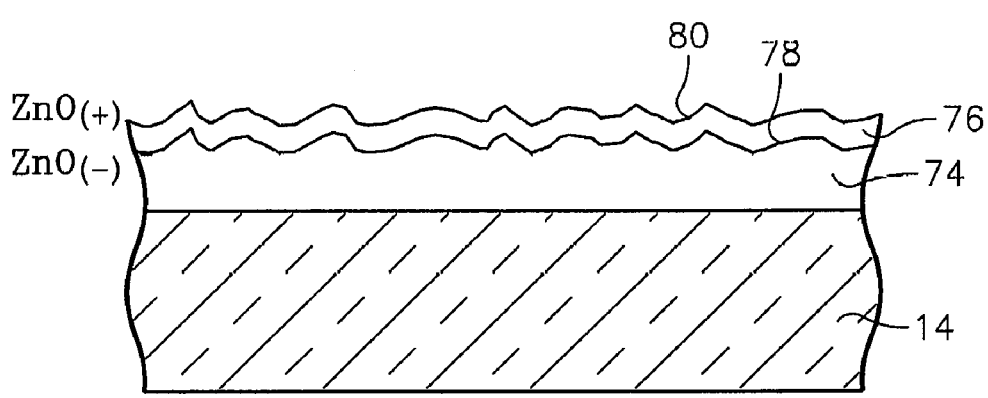
FIG. 7 is a cross-sectional view of a graded zinc oxide transparent electrode of one embodiment of the invention.

The process produces, as illustrated in the cross-sectional view of FIG. 7, a ZnO bilayer including an initial ZnO layer 74 grown with a low oxygen partial pressure and a final ZnO layer 76 grown with a higher oxygen partial pressure. In an exemplary recipe summarized in TABLE 1, the chamber pressure is maintained at about 3 to 5 milliTorr and in both steps argon is supplied into the sputtering chamber at a flow rate of 60 sccm. In the first step, oxygen gas is supplied into the sputtering chamber at a flow rate of 30 sccm, but in the second step oxygen gas is supplied at a flow rate of 60 sccm.

TABLE 1

|  | Step 1 | Step 2 |
| --- | --- | --- |
| Argon (sccm) | 60 | 60 |
| Oxygen (sccm) | 30 | 60 |

The initial layer 74 has a lower oxygen atomic fraction and hence a higher oxygen vacancy fraction (alternately expressed as a higher zinc or other cation interstitial fraction). Its composition can be represented as $ZnO_{(-)}$, that is, low in oxygen from unity stoichiometry. As a result, it is highly conducting to reduce the sheet resistance and also has a lower refractive index more closely matched to that of the glass substrate. The process conditions in this regime of higher oxygen vacancy rate also produces a textured surface 78 in the initial ZnO layer 74. The initial ZnO layer 74 is preferably relatively thick, for example, 800 nm to enhance its surface texturing in its textured surface 78. One other hand, the final layer 76 has a high oxygen atomic fraction and hence a lower oxygen vacancy fraction. Its composition can be represented as $ZnO_{(+)}$, that is, having a higher oxygen atomic fraction than the initial ZnO layer 74. The higher oxygen fraction increases the refractive index towards that of the adjacent silicon layer. If the final layer 76 is grown to be relatively thin, example, between 50 and 200 nm, the textured surface of the initial layer 74 in large part is replicated in a textured surface 80 of the final layer 76. Also, a thicker more conductive initial layer 74 reduces the sheet resistance for current to and from the lower electrode. Accordingly, it is preferred that the thickness of the final layer 76 is less than that of the initial layer 74, preferably no more than one-half that of the initial layer 74, and more preferably no more than one-quarter. In one of the examples, the thickness of the final layer 76 ratio was less one-tenth that of the initial layer 74. This relationship is opposite that of an initial seed layer, which should be much thinner than the final layer. The total thickness of the ZnO layers 76, 76 is preferably about 1 μm, for example, between 0.75 and 1.25 μm. Growth to such thicknesses regardless of growth method are required to produce the surface texturing.

The solar cell may be completed with the amorphous p-i-n silicon layer 20, the upper ZnO electrode 22, and the aluminum reflector 24 of FIG. 1. We have found further than the high oxygen content of the final ZnO layer 76 provides better chemical stability in the reducing hydrogen plasma used in the chemical vapor deposition of the amorphous silicon layer 20. The chemical stability produces better adhesion and a more stable interfacial electronic structure. The stability can be enhanced by preceding the PECVD of silicon with a hydrogen plasma passivation of the exposed ZnO layer.

Doping of zinc oxide with aluminum and other metallic elements is well known. See for example U.S. Pat. No. 5,736, 267 to Mitsui et al and U.S. Pat. No. 5,397,920 to Tran.

Aluminum doping levels in a range of 1 to 5 at % are preferred. Zinc oxide may be defined as a material composed of cations and oxygen in which at least 50% of the cations are zinc. This limitation corresponds to a metallic target for reactive sputtering containing at least 50 at % zinc although under some processing conditions the cation fraction in the reactively sputtered film does not precisely match the metal fraction in the target.

Although glass has been used for the transparent substrate in developing the invention, other transparent substrates, both rigid and flexible, may be used, for example, plastics and polymeric sheets and rolls. The sputtering apparatus is not limited to that of FIG. 2. Other types of sputtering apparatus may be used, such as the in-line system used to deposit onto a rolled substrate, as disclosed by Nakayama in U.S. Patent Application Publication 2002/0033331.

The two-step process of FIG. 6 producing the ZnO bilayer of FIG. 7 is the simplest structure of a graded ZnO electrode. The number of steps can be increased to more gradually increase the oxygen partial pressure and hence the oxygen fraction from one side to the other of the ZnO electrode. Reflection at the interfaces can of the ZnO sub-layers can be further reduced by a nearly continuous gradation of the oxygen content.

Although the described embodiments have been described as solar cells, the invention may also be applied to other types of photo detectors including photo diodes and to photo emitters such as flat panel lighting.

The invention claimed is:

1. A method of depositing a transparent electrode, comprising the steps of:
    depositing directly on a transparent substrate a first zinc oxide layer by reactively sputtering a metallic target comprising at least 50 at % of zinc in the presence of a first partial pressure of oxygen;
    depositing on the first zinc oxide layer a second zinc oxide layer by reactively sputtering the metallic target in the presence of a second partial pressure of oxygen greater than the first partial pressure; and
    depositing a silicon diode structure on the second zinc oxide layer, wherein the silicon diode structure includes a p-type layer on a side thereof facing the second zinc oxide layer and an n-type layer deposited on the p-type layer.

2. A method of depositing a transparent electrode, comprising the steps of:
    depositing directly on a transparent substrate a first zinc oxide layer having a first thickness and comprising a first metal component comprising at least 50 at % of zinc in the first zinc oxide layer and a first oxygen component of a first atomic fraction of oxygen in the first zinc oxide layer;
    depositing on the first zinc oxide layer a second zinc oxide layer having a second thickness less than the first thickness and comprising a second metal component comprising at least 50 at % of zinc in the second zinc oxide layer and a second oxygen component of a second atomic fraction of oxygen in the second zinc oxide layer, the second atomic fraction being greater than the first atomic fraction; and
    depositing a silicon diode structure on the second zinc oxide layer, wherein the silicon diode structure includes a p-type layer on a side thereof facing the second zinc oxide layer and an n-type layer deposited on the p-type layer.

3. The method of claim 2, further comprising depositing a metal contact layer over the silicon diode structure.

4. The method of claim 1, wherein the first zinc oxide layer has a first thickness and the second zinc oxide layer has a second thickness less than the first thickness.

5. The method of claim 4, wherein the second thickness is no more than one-half of the first thickness.

6. The method of claim 5, wherein the second thickness is no more than one-quarter of the first thickness.

7. The method of claim 4, wherein a sum of the thickness of the first and second zinc oxide layers is between 0.75 and 1.25 μm.

8. The method of claim 1, wherein the silicon diode structure comprises an amorphous silicon p-i-n structure which is amorphous and deposited by chemical vapor deposition.

9. The method of claim 1, wherein the steps of depositing the first and second zinc oxide layers comprise DC magnetron sputtering.

10. The method of claim 2, wherein the second thickness is no more than one-half of the first thickness.

11. The method of claim 10, wherein the second thickness is no more than one-quarter of the first thickness.

12. The method of claim 2, wherein a sum of the first and second thicknesses is between 0.75 and 1.25 μm.

13. The method of claim 2, wherein the two depositing steps of depositing the first and second zinc oxide layers comprise DC magnetron reactive sputtering.

14. The method of claim 1, wherein the metallic target additionally comprises aluminum.

15. The method of claim 2, wherein at least one of the first and second metal components additionally comprises aluminum.

16. The method of claim 15, wherein both of the first and second metal components additionally comprise aluminum.

17. The method of claim 1, further comprising depositing a metal contact layer over the silicon diode structure.

* * * * *